(12) United States Patent
Garampazzi

(10) Patent No.: US 10,637,487 B1
(45) Date of Patent: Apr. 28, 2020

(54) TUNABLE VOLTAGE CONTROLLED OSCILLATORS

(71) Applicant: Inphi Corporation, Santa Clara, CA (US)

(72) Inventor: Marco Garampazzi, Pavia (IT)

(73) Assignee: INPHI CORPORATION, Santa Clara, CA (US)

(*) Notice: Subject to any disclaimer, the term of this patent is extended or adjusted under 35 U.S.C. 154(b) by 0 days.

(21) Appl. No.: 16/273,047

(22) Filed: Feb. 11, 2019

(51) Int. Cl.
| H03L 7/18 | (2006.01) |
| H03L 7/23 | (2006.01) |
| H03B 5/12 | (2006.01) |

(52) U.S. Cl.
CPC .............. *H03L 7/18* (2013.01); *H03B 5/1237* (2013.01); *H03L 7/23* (2013.01)

(58) Field of Classification Search
None
See application file for complete search history.

(56) References Cited

U.S. PATENT DOCUMENTS

| 5,187,722 | A * | 2/1993 | Petty | H03L 7/0991 331/25 |
| 6,911,870 | B2 * | 6/2005 | Gierkink | H03B 27/00 331/117 FE |
| 7,193,484 | B2 * | 3/2007 | Maeda | H03B 5/1228 331/117 FE |
| 7,336,134 | B1 * | 2/2008 | Janesch | H03L 7/0991 331/117 R |
| 7,362,192 | B1 * | 4/2008 | Lin | H03B 5/1228 331/117 FE |
| 7,659,784 | B2 * | 2/2010 | Jang | H03B 19/14 331/117 R |
| 8,134,421 | B2 * | 3/2012 | Hirashiki | H03B 27/00 331/108 D |
| 8,264,288 | B2 * | 9/2012 | Lin | H03B 5/1228 331/107 SL |
| 8,436,689 | B2 * | 5/2013 | Lee | H03B 27/00 331/117 FE |
| 9,018,987 | B1 * | 4/2015 | Lahiri | H03K 3/0315 327/114 |
| 2003/0171105 | A1 * | 9/2003 | Dunworth | H03L 7/0898 455/258 |
| 2009/0243740 | A1 * | 10/2009 | Rofougaran | H03L 7/099 331/177 R |
| 2013/0181783 | A1 * | 7/2013 | Upadhyaya | H03B 5/1228 331/117 FE |

* cited by examiner

*Primary Examiner* — Cassandra F Cox
(74) *Attorney, Agent, or Firm* — Richard T. Ogawa; Ogawa P.C.

(57) ABSTRACT

A tunable voltage oscillator expands a voltage oscillator's tuning range and compensate for any frequency spread present in the voltage oscillator. The tunable voltage oscillator multiplies a frequency of a periodic signal generated by the voltage oscillator by a fractional number. This fractional number is determined by a desired frequency range and an actual frequency range of the voltage oscillator. As such, the frequency range of the output periodic signal is tuned into the desired range. The voltage oscillator can include a programmable inductor of which the inductance can be adjusted thereby to expand the frequency range by increasing the quality factor in the low frequency range.

7 Claims, 5 Drawing Sheets

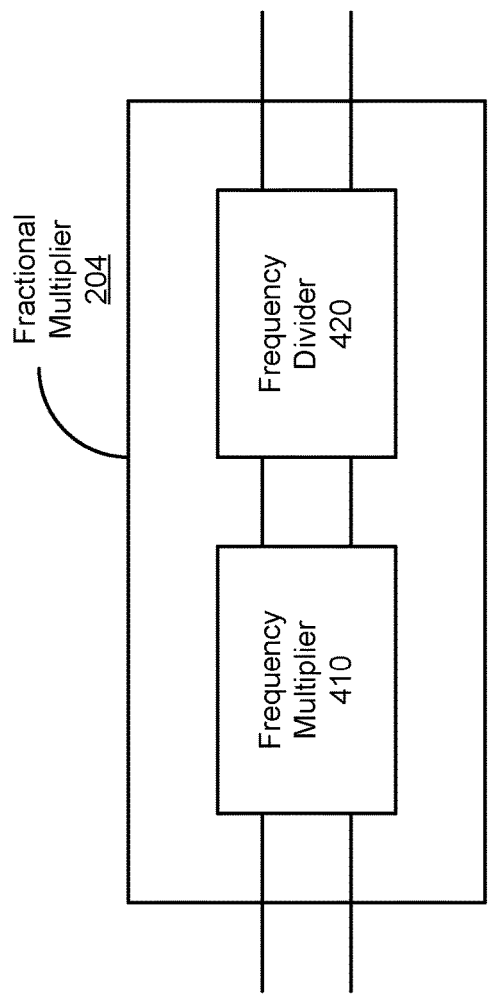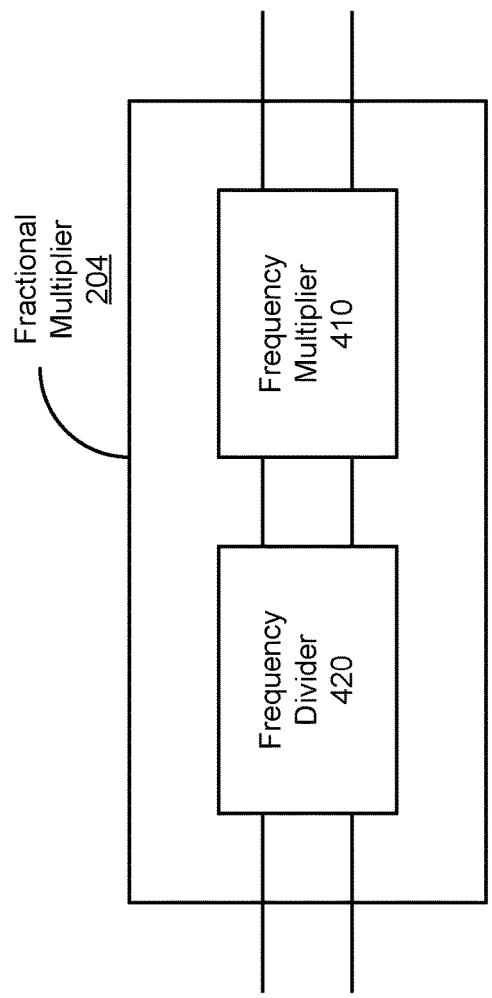

TUNABLE VOLTAGE CONTROLLED OSCILLATORS

BACKGROUND

1. Field of the Disclosure

This disclosure pertains to voltage controlled oscillators (VCOs), and more specifically to expanding turning range for VCOs.

2. Description of the Related Art

Voltage controlled oscillators (VCOs) are electronic circuits of which the output oscillation frequency is a function of the input voltage. VCOs are widely used in many applications such as various communication circuits to generate synchronization signals. For example, VCOs are of the important basic building blocks in phase lock loops (PLL) that generate an output signal of which the phase is related to the phase of the input signal. VCOs are needed to generate clock frequencies for different functional blocks such as general purpose processor/memory clocks, analog to digital and digital to analog conversion clocks, digital signal processing clocks, etc.

The VCO may generate any number of clock signals required to operate multiple circuit blocks within the integrated circuit or sent to external circuits and signal interfaces. The VCO may be customized for different frequency ranges and jitter specifications. As an integrated circuit must be designed with supply voltages as low as possible to operate with minimal power consumption and within the breakdown voltage of the silicon process, it is particularly difficult for VCOs to meet the stringent frequency ranges requirements of low-voltage and high-frequency or data-rate systems.

SUMMARY

A tunable voltage oscillator expands a voltage oscillator's tuning range and compensate for any frequency spread present in the voltage oscillator. The tunable voltage oscillator multiplies a frequency of a periodic signal generated by the voltage oscillator by a fractional number. This fractional number is determined by a desired frequency range and an actual frequency range of the voltage oscillator. As such, the frequency range of the output periodic signal is tuned into the desired range. The voltage oscillator can include a programmable inductor of which the inductance can be adjusted thereby to expand the frequency range.

BRIEF DESCRIPTION OF THE DRAWINGS

The teachings of the embodiments disclosed herein can be readily understood by considering the following detailed description in conjunction with the accompanying drawings.

FIG. 4A illustrates a first implementation of the fractional multiplier using a frequency multiplier and a frequency divider connected in series, according to one embodiment.

FIG. 4B illustrates a second implementation of the fractional multiplier using a frequency multiplier and a frequency divider connected in series, according to one embodiment.

DETAILED DESCRIPTION

The Figures (FIG.) and the following description relate to various embodiments by way of illustration only. It should be noted that from the following discussion, alternative embodiments of the structures and methods disclosed herein will be readily recognized as viable alternatives that may be employed without departing from the principles discussed herein. Reference will now be made in detail to several embodiments, examples of which are illustrated in the accompanying figures. It is noted that wherever practicable similar or like reference numbers may be used in the figures and may indicate similar or like functionality.

Figure 1:
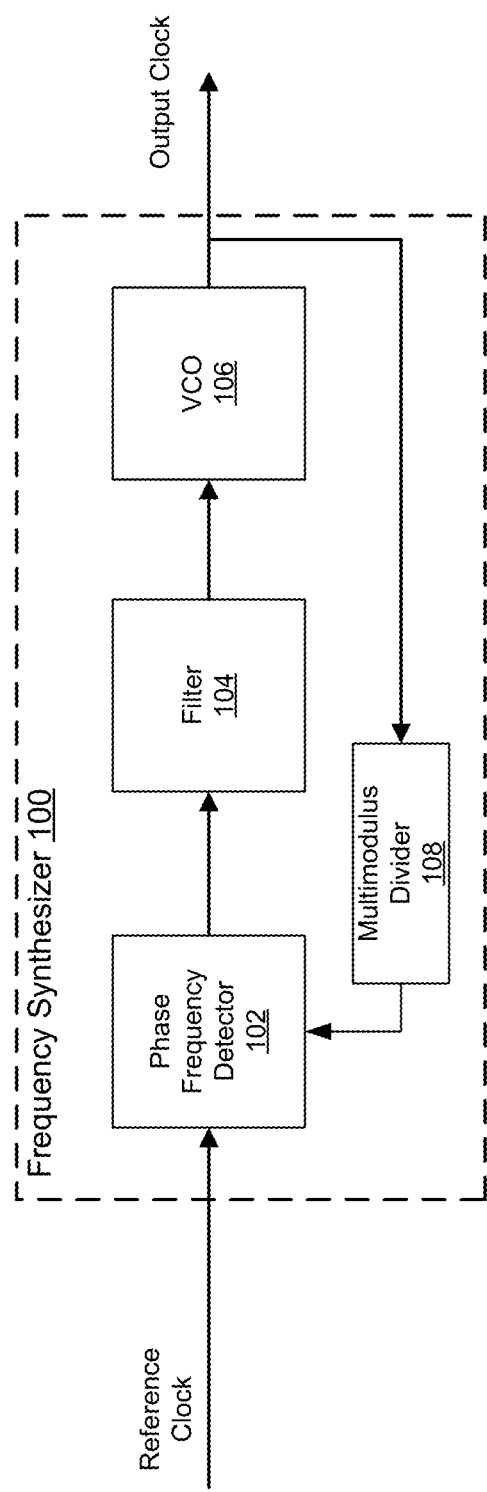
FIG. 1 is a block diagram illustrating an example phase locked loop (PLL) based frequency synthesizer.

FIG. 1 is a block diagram illustrating an example phase locked loop (PLL) based frequency synthesizer 100. The frequency synthesizer 100 generates a range of frequencies from a single reference frequency and is suitable for use in a communication system such as a transceiver. The example frequency synthesizer 100 includes a phase frequency detector 102, a low pass filter 104, a voltage oscillator (VCO) 106, and a multimodulous divider 108. The phase frequency detector 102 compares the phases of two input signals: a reference clock signal and a clock signal that is generated based on an output clock signal generated by the frequency synthesizer 100. The phase frequency detector 102 outputs an error signal that is proportional to the difference between the reference clock signal and the output clock signal. The error signal is provided to the low pass filter 104 which is used to drive a voltage-controlled oscillator (VCO) 106. The VCO 106 outputs the output clock signal having an output frequency that is determined based on the error signal. The output frequency is fed through a multimodulous divider 108 to the phase frequency detector 102. The multimodulous divider 108 is a frequency divider that can be programmed by the system based on the output frequency of the output clock signal. The multimodulous divider 108 creates a negative feedback loop. If the output frequency drifts from the input reference clock signal, the phase error signal increases which drives the output clock signal to be in phase with the reference clock signal.

The multimodulous divider 108 can be a digital counter that counts down at each cycle of the output clock signal. When the counter reaches zero, the counter output changes state and resets the initial value. For example, if the reference signal is 800 MHz and the counter is set of 10, the VCO 106 must run at a frequency that is 8 GHz.

The VCO's tuning range limits the output frequency range of the clock signal. The frequency synthesizer 100 cannot generate an output clock signal that is outside the tuning range of the VCO 106.

Figure 2:
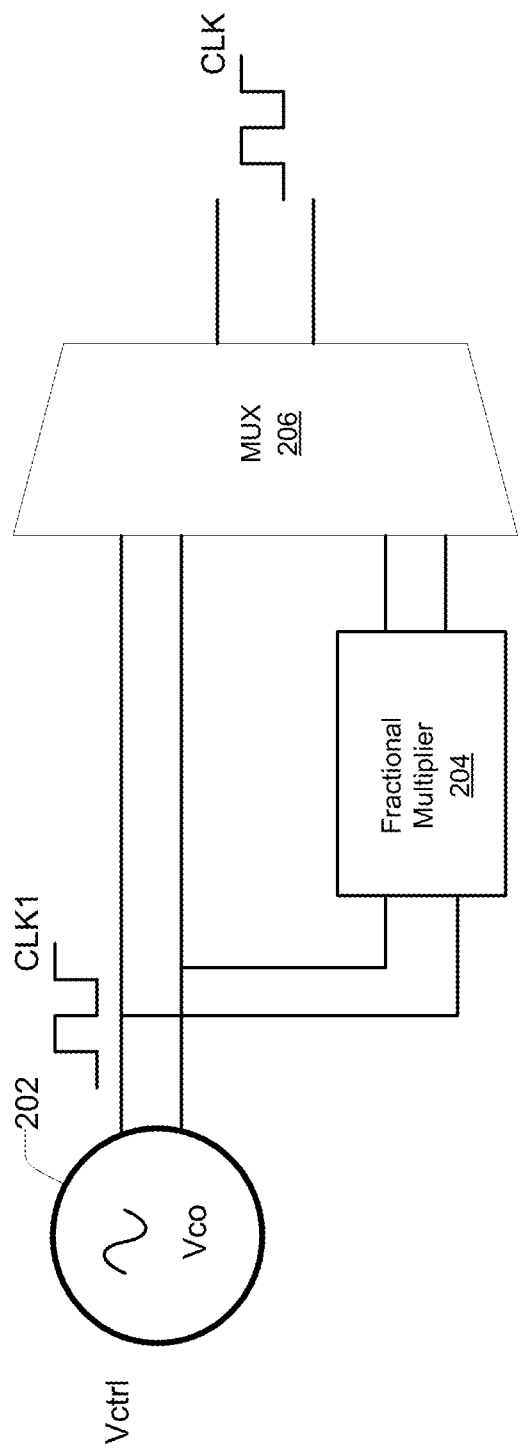
FIG. 2 is a block diagram of a tunable VCO, according to one embodiment.

FIG. 2 is a block diagram of a tunable VCO 106, according to one embodiment. The tunable VCO 106 includes a VCO 202, a fractional multiplier 204, and a multiplexer 206. The tunable VCO 106 generates an output periodic signal of which the frequency range can be tuned into a desired range. The tunable VCO 106 receives an input voltage Vctrl and outputs an output periodic signal CLK according to the input voltage Vctrl. The output periodic signal CLK has a frequency range that can be adjusted to a desired range. The VCO 202 is a voltage oscillator that generates a clock signal having a frequency range that can be subject to fabrication processes. Across corners, the output frequency of the VCO 202 has a lowest tuning range (fmin$_{actual}$, fmax$_{actual}$). In particular, fmin$_{actual}$ equals to fmin$_{MAX}$ that is the highest value of a minimum programmed frequency among all process corners and fmax$_{actual}$ equals to f$_{MAXmin}$ that is the lowest value of a maximum programmed frequency among all process corners. A process corner is characterized by a combination of fabrication and operation parameters such as processes, voltage, and temperature (PVT). The fractional tuner 104 is a frequency multiplier or divider that can multiply or divide by a fractional number N. In various embodiments, this fractional number equals to max(fmin$_{actual}$,fmin$_{spec}$)/min(fmin$_{actual}$,fmin$_{spec}$) or max ax actual, fmax$_{spec}$)/min(fmax$_{actual}$,fmax$_{spec}$), where fmin$_{actual}$ is the minimum oscillation frequency of the actual tuning range of the VCO 202, fmax$_{actual}$ is the maximum oscillation frequency of the actual tuning range of the VCO 202, fmin$_{spec}$ is the minimum output oscillation frequency of the tuning range of the VCO 106, and fmax$_{spec}$ is the maximum output oscillation frequency of the tuning range of the VCO 106. The fractional tuner 104 can be implemented by a combination of one or more multiplier and dividers. For example, a fractional tuner 104 having a gain of 1.5 can be implemented by a multiplier of 3 and a divider of 2. The multiplexer 206 can combine multiple clock signals of different frequencies into one output clock signal.

Given a numerical example, the required tuning range is from 7.5 GHz to 15 GHz, and the VCO 202 has a tuning range of 10-15 GHz. The VCO 202 has a turning range of 10 to 16 GHz at one corner and a running range of 9 to 15 GHz at another corner. The fractional multiplier 204 has a gain of 1.5. The fractional multiplier 204 can be implemented by a multiplier of 3 and a divider of 2. This implementation can provide the required tuning range by overcoming the frequency spreads, avoiding designing cross corners as well as relaxing the VCO design allowing a lower tuning range than the one required.

Compared to the VCO 202, the VCO 106 extends the tuning range of the VCO 202, stabilizes any frequency spread of the oscillator 202, relaxes the design requirements of the oscillator 202.

Figure 3A:
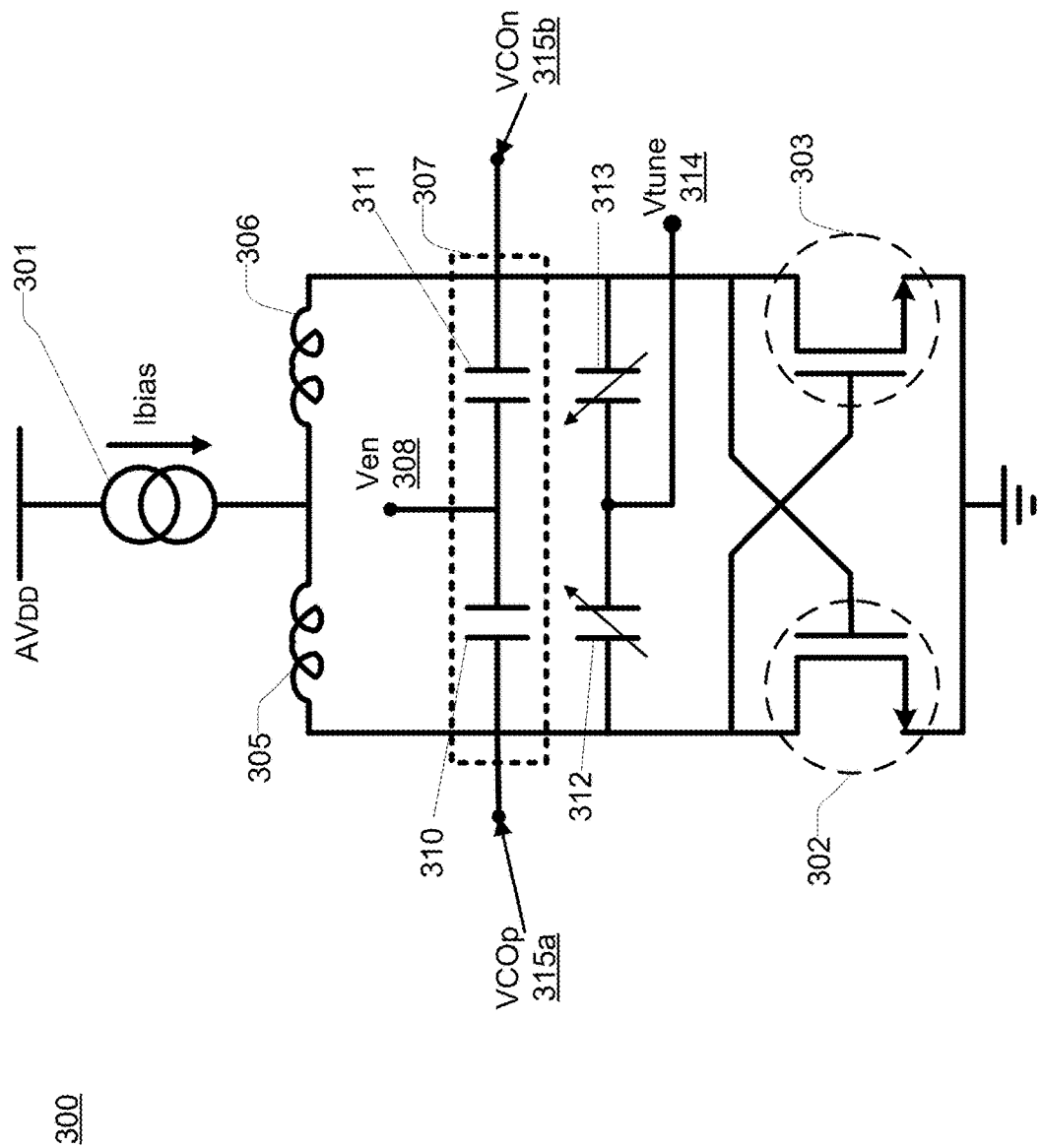
FIG. 3A is a circuit diagram illustrating an example implementation of a VCO, according to one embodiment.

FIG. 3A illustrates is a circuit diagram illustrating an example implementation of a VCO 300, according to one embodiment. The VCO 300 includes a current source 301, transistors 302, 303, inductors 305, 306, a capacitor bank 307, and varactors 312, 313. The inductors 305, 306 are coupled in series. The capacitor bank 307 includes capacitors 310, 311 that are coupled in series. One terminal of the inductor 305 is coupled to one terminal of the inductor 306 both of which are coupled to the current source 301. One terminal of the capacitor 310 is connected to one terminal of the capacitor 311 both of which are coupled to a terminal 308. One terminal of the varactor 312 is connected to one terminal of the varactor 313 both of which are coupled to a terminal 314. The other terminal of the inductor 305, the other terminal of the capacitor 310, and the other terminal of the varactor 312 are connected to an output terminal 315a. The other terminal of the inductor 306, the other terminal of the capacitor 307, and the other terminal of the varactor 313 are connected to an output terminal 315b. Output clock signals can be obtained from the output terminals 315a, 315b. The gate of the transistor 302 is coupled to the drain of the transistor 303 both of which are coupled to the output terminal 315b. The gate of the transistor 303 is coupled to the drain of the transistor 302 both of which are coupled to the output terminal 315a. The sources of the transistors 302, 303 are coupled together both of which are connected to the ground.

In operation, to generate a clock signal, an enable voltage is provided to the terminal 308 to enable the capacitor bank 307 to resonate with the inductors 305, 306. Absent the enable voltage, the capacitors 310, 311 in the capacitor bank 307 are disconnected from resonating with the inductors 305, 306. The transistors 302, 303 are so connected to implement a negative resistance to neutralize with the resistance of the LC resonant circuit such that the output clock signal have a substantial constant voltage.

To vary the frequency of the output clock signal, a tuning voltage signal is provided to the terminal 314 to vary the capacitance of the varactors 312, 313. The capacitance of the varactors 312, 313 can be varied by the voltage level provided at the terminal 314. The capacitor array 307 can use transistor switches with small parasitic capacitance to switch the capacitors 310, 311 to improve the tuning range. However, small parasitic capacitances may increase switching resistances compared to large parasitic capacitances and reduce the quality factor. In some embodiments, one or both of the inductors 305, 306 can be a programmable inductor. The programmable inductor can extend the tuning range at a cost of a lower quality factor due to series resistance of the switches. In the capacitor array 307, a wide tuning range requires a small parasitic capacitance of the transistor switches. However, this requirement leads to a higher resistance and lower quality factor.

Figure 3B:
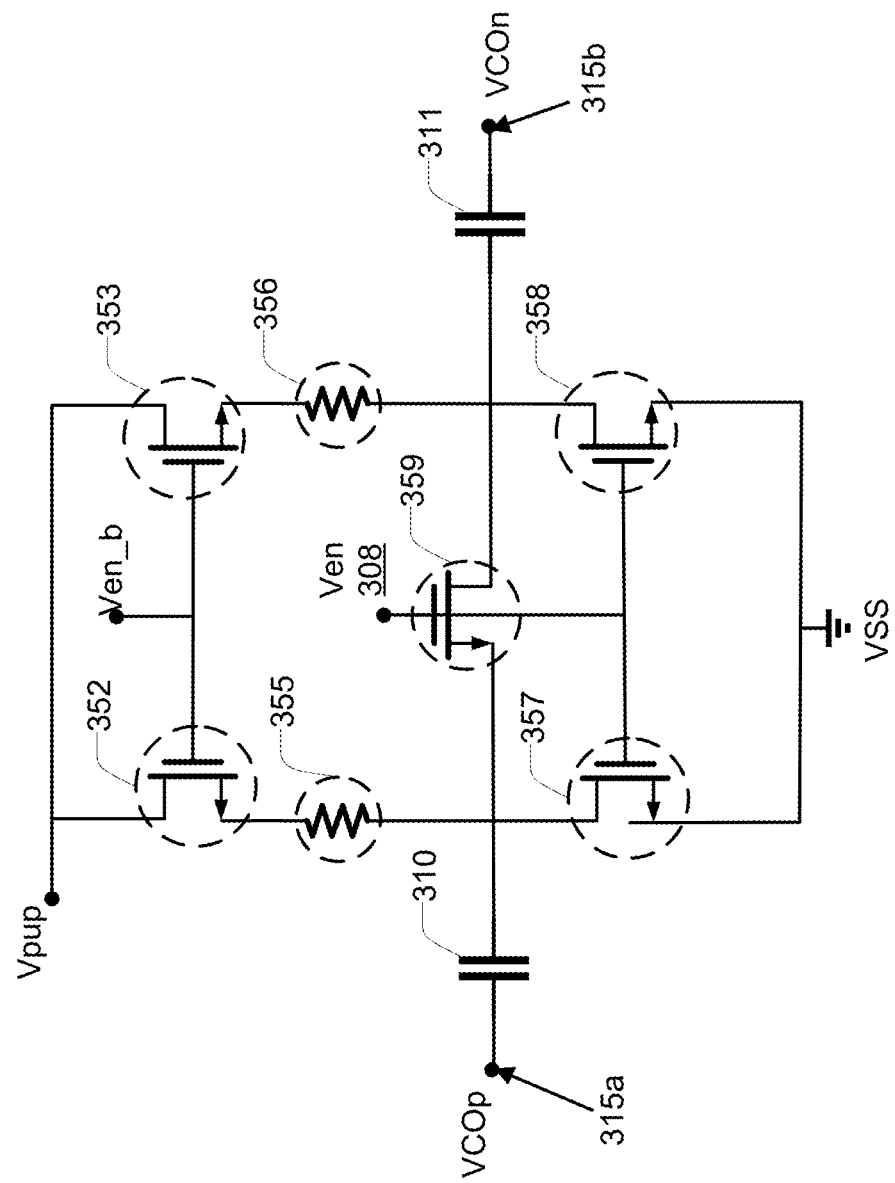
FIG. 3B illustrates an example implementation of a capacitor bank, according to one embodiment.

FIG. 3B illustrates an example implementation of a capacitor bank 307, according to one embodiment. The example capacitor bank 350 includes transistors 352, 353, 357, 358, 359, resistors 355, 356, and capacitors 310, 311. The drains and gates of the transistors 352, 353 are connected to a bias voltage Vpup. The gates of the transistors 352, 353 are connected to a negative enable voltage Ven_b. The phase of the negative enable voltage Ven_b is opposite to that of the enable voltage Ven. The sources of the transistors 352, 353 are connected to the resistors 355, 356, respectively. The drains of the transistors 357, 358 are connected to the resistors 355, 356, respectively. The sources of the transistors 357, 358 are connected to the ground. In addition, the transistor 359 is connected between the two pullup resistors 355, 356. The gate of the transistor 359 is coupled to the terminal 308. If the enable voltage Ven is high, the transistors 357, 358 and 359 are switched on, and the capacitors 310, 311 resonate with the inductors 305, 306. Absent the enable voltage, the transistors 352 and 353 are switched on while the transistors 357, 358 and 359 are switched off. The capacitors 310, 311 are connected through the resistors 355 and 356 to the bias voltage Vpup. The high impedance realized with the resistor 355 and 356 is used to disconnect the capacitors 310 and 311 from resonating with the inductors 305, 306.

FIG. 4A illustrates a first implementation of the fractional multiplier 204 using a frequency multiplier 410 and a frequency divider 420 connected in series, according to one embodiment. FIG. 4B illustrates a second implementation of the fractional multiplier 204 using a frequency multiplier 410 and a frequency divider 420 connected in series, according to one embodiment. In the implementation of FIG. 4A, the output of the frequency multiplier 410 is connected to the input of the frequency divider 420. As such, the fractional multiplier 204 first multiples the frequency of the input signal by a factor of M and then divides the frequency of the signal by D to achieve a fractional number of M/D. In the implementation of FIG. 4B, the output of the frequency divider 420 is connected to the input of the frequency multiplier 410. As such, the fractional multiplier 204 first divides the frequency of the input signal by a factor of D and then multiplies the frequency of the signal by M to achieve a fractional number of M/D. Although the implementations of FIGS. 4A and 4B show one frequency multiplier and one frequency divider, in some embodiments, multiple frequency multipliers or multiple frequency dividers may be used. In yet other embodiments, other implementations of a fractional multiplier 204 may be used.

In further embodiments, one or both of the inductors 305, 306 are a programmable inductor. The programmable inductor can improve the quality factor in the low frequency range thereby to extend the tuning range. This is because a wide tuning range requires a small parasitic capacitance of the transistor switches. However, this requirement leads to a higher resistance and lower quality factor. In the low frequency range, the capacitance quality factor that decreases with frequency becomes more important. The quality factor is typically determined by the drain-to-source resistor of the transistor 359.

While particular embodiments and applications of the present disclosure have been illustrated and described, it is to be understood that the embodiments are not limited to the precise construction and components disclosed herein and that various modifications, changes and variations may be made in the arrangement, operation and details of the method and apparatus of the present disclosure disclosed herein without departing from the spirit and scope of the disclosure.

What is claimed is:

1. A tunable voltage oscillator comprising:
   a voltage oscillator configured to generate a first periodic signal according to a control voltage, the first periodic signal having a first frequency in a first frequency range defined by a first minimum value and a first maximum value;
   a fractional multiplier configured to receive the first periodic signal and to generate a second periodic signal by multiplying a first frequency of the first periodic signal by a fractional number, the second periodic signal having a second frequency in a second frequency range defined by a second minimum value and a second maximum value, the fractional number being the second minimum value divided by the first minimum value or the second maximum value divided by the first maximum value; and
   a multiplexer configured to combine the first periodic signal and the second periodic signal to generate an output periodic signal.

2. The tunable voltage oscillator of claim 1, wherein the first frequency range is determined at a process corner of the voltage oscillator, the process corner having a highest value of a minimum programmed frequency and a lowest value of a maximum programmed frequency among all process corners of the voltage oscillator.

3. The tunable voltage oscillator of claim 1, wherein the fractional multiplier includes at least one multiplier and at least one divider that are connected in series, the at least one multiplier and at least one divider configured to multiply the first frequency of the first periodic signal by the fractional number.

4. The tunable voltage oscillator of claim 1, wherein the voltage oscillator comprises a current source configured to provide a current, a first inductor, a second inductor, a capacitor bank, a first transistor, and a second transistor, the current source is coupled to a first terminal of the first inductor and a first terminal of the second inductor, a first terminal of the capacitor bank coupled to a second terminal of the first inductor that is further coupled to a first output terminal, a second terminal of the capacitor bank coupled to a second terminal of the second inductor that is further coupled to a second output terminal, the first output terminal coupled to a drain of the first transistor and a gate of the second transistor, the second output terminal coupled to a drain of the second transistor and a gate of the first transistor, and a source of the first transistor coupled to a source of the second transistor that is further coupled to the ground, wherein the capacitor bank is configured to oscillate with the first inductor and the second inductor to output the first periodic signal from the first output terminal and the second output terminal.

5. The tunable voltage oscillator of claim 4, wherein the capacitor bank comprises a first capacitor and a second capacitor coupled in series, the first output terminal coupled to a first terminal of the first capacitor, the second output terminal coupled to a first terminal of the second capacitor, and a second terminal of the first capacitor that is connected to a second terminal of the second capacitor.

6. The tunable voltage oscillator of claim 4, wherein the voltage oscillator further comprises a first varactor and a second varactor coupled in series, the first output terminal coupled to a first terminal of the first varactor, the second output terminal coupled to a first terminal of the second varactor, the second terminal of the first varactor coupled to the second terminal of the second varactor and configured to receive a voltage to adjust the first frequency of the first periodic signal.

7. The tunable voltage oscillator of claim 4, wherein the at least one of the first inductor and the second inductor is a programmable inductor.

* * * * *